United States Patent
Tseng et al.

(10) Patent No.: US 6,746,968 B1
(45) Date of Patent: Jun. 8, 2004

(54) METHOD OF REDUCING CHARGE LOSS FOR NONVOLATILE MEMORY

(75) Inventors: Uway Tseng, Taichung (TW); Ching-Yu Chang, Ilai (TW); Hung-Yu Chiu, Kaohsiung (TW); Wenpin Lu, Ilan (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/364,428

(22) Filed: Feb. 12, 2003

(51) Int. Cl.⁷ ............................................... H01L 21/31
(52) U.S. Cl. ....................................................... 438/770
(58) Field of Search ................................ 438/770, 477

(56) References Cited

U.S. PATENT DOCUMENTS 6,071,784 A * 6/2000 Mehta et al. ............... 438/303
6,635,943 B1 * 10/2003 Hui et al. ................... 257/506
2003/0124873 A1 * 7/2003 Xing et al. ................. 438/770

* cited by examiner

Primary Examiner—David Nelms
Assistant Examiner—Quoc Hoang
(74) Attorney, Agent, or Firm—Birch, Stewart, Kolasch & Birch, LLP

(57) ABSTRACT

A method of reducing charge loss for nonvolatile memory. First, a semiconductor substrate having a semiconductor device thereon is provided. Next, a dielectric layer is formed on the entire surface of the semiconductor substrate, and a thermal treatment is performed in an atmosphere containing a reactive gas, and the reactive gas reacts with free ions remaining on the semiconductor substrate from prior manufacturing processes. Finally, a metal layer is formed on the dielectric layer.

9 Claims, 5 Drawing Sheets

METHOD OF REDUCING CHARGE LOSS FOR NONVOLATILE MEMORY

BACKGROUND OF THE INVENTION

1. Field of the Invention

The present invention relates in general to the semiconductor manufacturing process, and particularly to a method of reducing charge loss for a nonvolatile memory cell.

2. Description of the Related Art

Nonvolatile memory cell arrays such as EPROMs, FLASH EPROMs and EEPROMs have gained widespread acceptance in the industry. Nonvolatile memory cells do not require periodic refresh pulses needed by the capacitive storage elements of conventional one-device dynamic random access memory (DRAM) cells. This presents an appreciable power saving. Because they rely upon charge injection/removal to establish the stored logic state, the write cycles of nonvolatile memory cells are appreciably longer than those of DRAM's.

It has been observed that there are data retention problems in nonvolatile memory cell arrays. It has been postulated that the poor data retention is due to mobile ions such as Na+, K+, or the like that approach the floating gate in the nonvolatile memory cell and cause the charge on the floating gate to be lost. For example, an inter-layer dielectric (ILD) layer (made up of a high dielectric reflowable material such as phosphosilicate glass or borophosphosilicate glass) is formed on the wafer. The manufacturing process for forming the ILD layer, such as deposition, photolithography and etching, causes the mobile ions to be introduced to approach the floating gate in the nonvolatile memory cell, seriously affecting device reliability.

SUMMARY OF THE INVENTION

It is therefore an object of the present invention to provide a method for reducing charge loss for a nonvolatile memory cell to enhance reliability.

The method comprises the subsequent steps. First, a semiconductor substrate having a semiconductor device thereon is provided. Next, a dielectric layer is formed on the entire surface of the semiconductor substrate. Then, thermal treatment is performed in an atmosphere containing a reactive gas, and the reactive gas reacts with free ions remaining from the semiconductor substrate during manufacturing processes. Finally, a metal layer is formed on the dielectric layer.

According to the present invention, a passivation is further formed on the metal layer after formation thereof. The thermal treatment can be performed after forming the dielectric layer. Also, the thermal treatment can be formed after forming the passivation.

According to the present invention., step of performing thermal treatment can be replaced by introducing anions to react with cations remaining in the semiconductor. Step of performing thermal treatment can also be replaced by introducing a gas to react with dangling bonds of the whole semiconductor substrate.

BRIEF DESCRIPTION OF THE DRAWINGS

The above and other objects, features, and advantages of the present invention will become apparent from the subsequent detailed description of preferred embodiments of the invention explained with reference to the accompanying drawings, in which.

DETAILED DESCRIPTION OF THE INVENTION

There will now be described an embodiment of this invention with reference to the accompanying drawings.

Figure 2A:
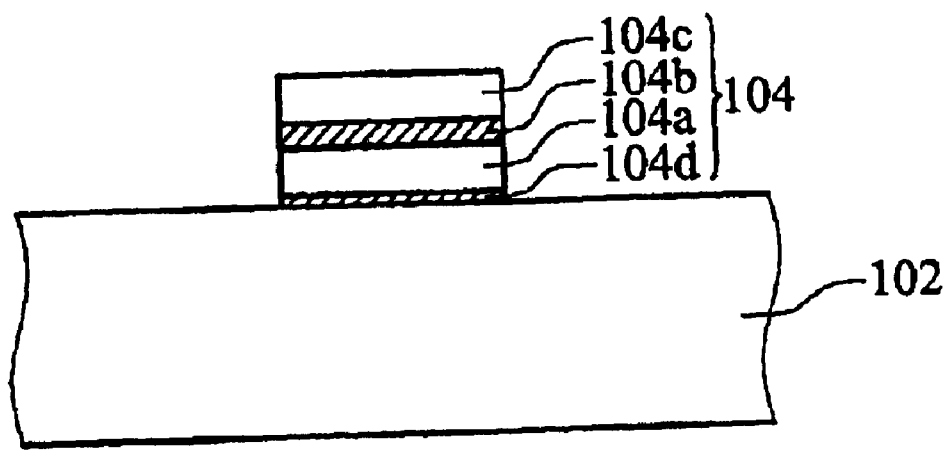
FIGS. 2A–2D are schematic cross-sections illustrating steps of reducing charge loss for non-volatile memory according to the preferred embodiment of the present invention.

First, in step S100, a semiconductor substrate comprising any well known non-volatile memory device, such as an erasable programmable read-only memory (EPROM), an electrically erasable programmable read-only memory (EEPROM), or flash memory, is provided. A flash memory consisting of a floating gate 104a, a dielectric gate 104b, a controlling gate 104c, and a tunnel oxide 104d, is taken as an example in FIG. 2A.

Figure 2B:
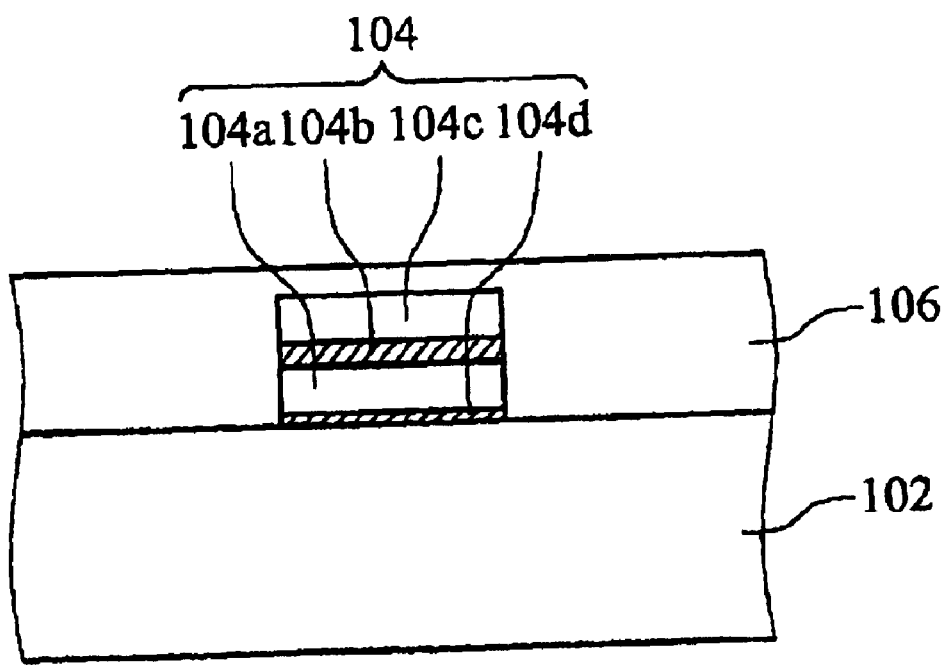

Next, in step S102, a dielectric layer 106 is preferably formed on the entire surface of the substrate 102 by chemical vapor deposition (CVD), as shown in FIG. 2B. The dielectric layer 106 comprises boro-phospho silicate glass (BPSG), phosphosilicate glass (PSG), or doped high density plasma oxide.

In step S104, a thermal treatment is performed in an atmosphere containing a reactive gas. If the dielectric layer comprises BPSG, the thermal treatment S104 is flow process as well known at the temperature of about 500~800 ° C. for 15~75 minutes. The reactive gas containing a oxygen based gas, such as oxygen (O2), compounds containing nitrogen (N2) and oxygen(O2), or nitrous oxide (N2O), reacts with free ion, such as Na+ or H+, residue in the whole semiconductor substrate from any previous manufacturing processes. For example, oxygen, residue somewhere in the semiconductor during manufacturing process, can react with introduced hydrogen ions to form evaporating water. Thus, because the free ion residue is eliminated, subsequent program charges in the memory cell 104 do not react with the free ion residue, thereby reducing charge loss.

Figure 2C:
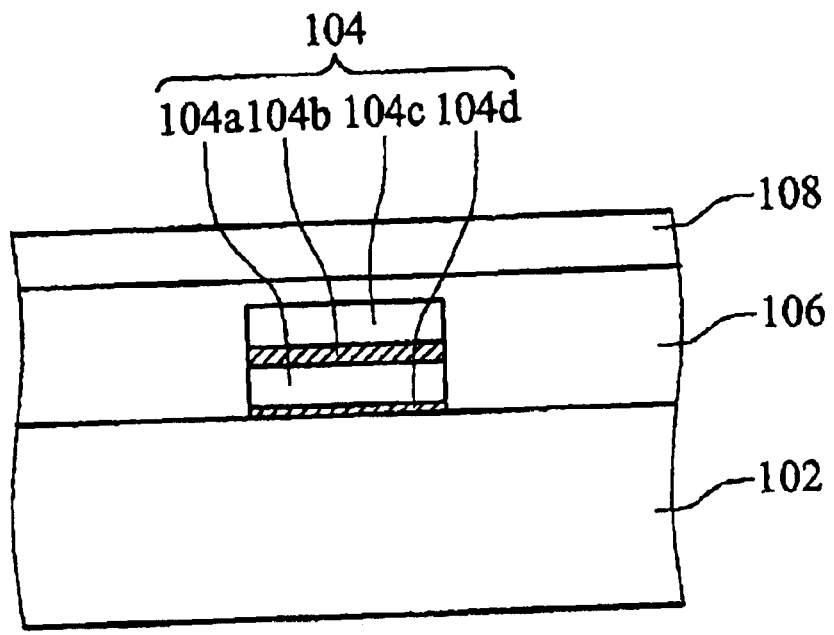
Figure 2D:
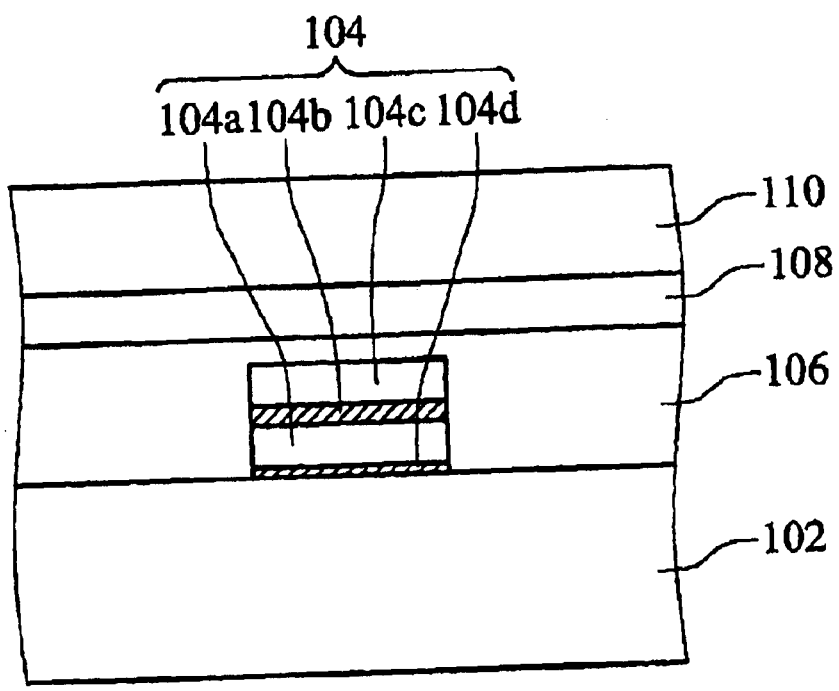

In step S106, a metal layer 108 for interconnect is preferably formed by CVD, as shown in FIG. 2C. The metal layer 108 comprises a copper alloy or an aluminum alloy. To simplify and clarify the manufacturing process according to the present invention, the metal layer 108 and the dielectric layer 106 are described as a simple single structure herein. However, the structure can be modified to form a real morphology of a nonvolatile memory device by anyone skilled in the art. A passivation 110 can be further formed on the metal layer 108, as shown in FIG. 2D.

According to the present invention, the thermal treatment can be replaced by introducing anions in step S104, to react with mobile cations to prevent reaction during the subsequent program charge of the memory cell 104. For example, mobile chlorine ions (Cl−), remaining somewhere in the semiconductor from prior manufacturing process, can react with introduced sodium ions (Na+) to form chlorine sodium (NaCl). Therefore, because the residue cations are eliminated, subsequent the program charges in the memory cell 104 do not react with the free ion residue, thereby reducing charge loss.

According to the present invention, the thermal treatment can be replaced with a dangling bond removing process in step S104. The dangling bond removing process comprises introducing a reactive gas, such as oxygen (O2), ozone (O3), or nitrous oxide (N2O), to react with dangling bonds in the substrate to prevent the dangling bonds from reacting during the subsequent program charge of the memory cell 104. The dangling bond in the semiconductor substrate comprises H., B., P., Si . . . et al. Therefore, because the dangling bonds are eliminated, the subsequent program charges in the memory cell 104 do not react with the dangling bonds of the semiconductor, preventing charge loss.

Figure 1:
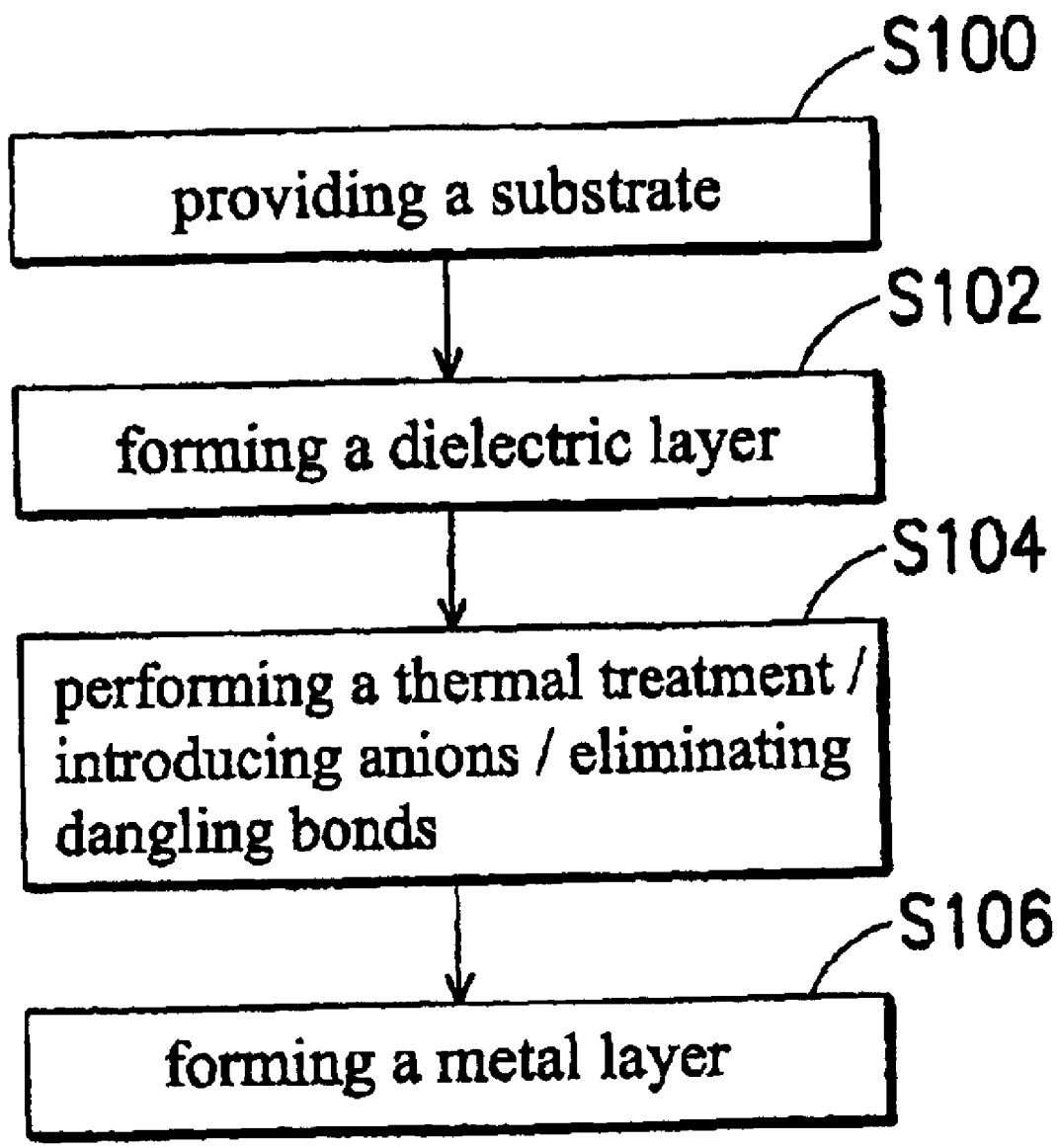
FIG. 1 is a flowchart illustrating steps of reducing charge loss for non-volatile memory according to the present invention.
Figure 3:
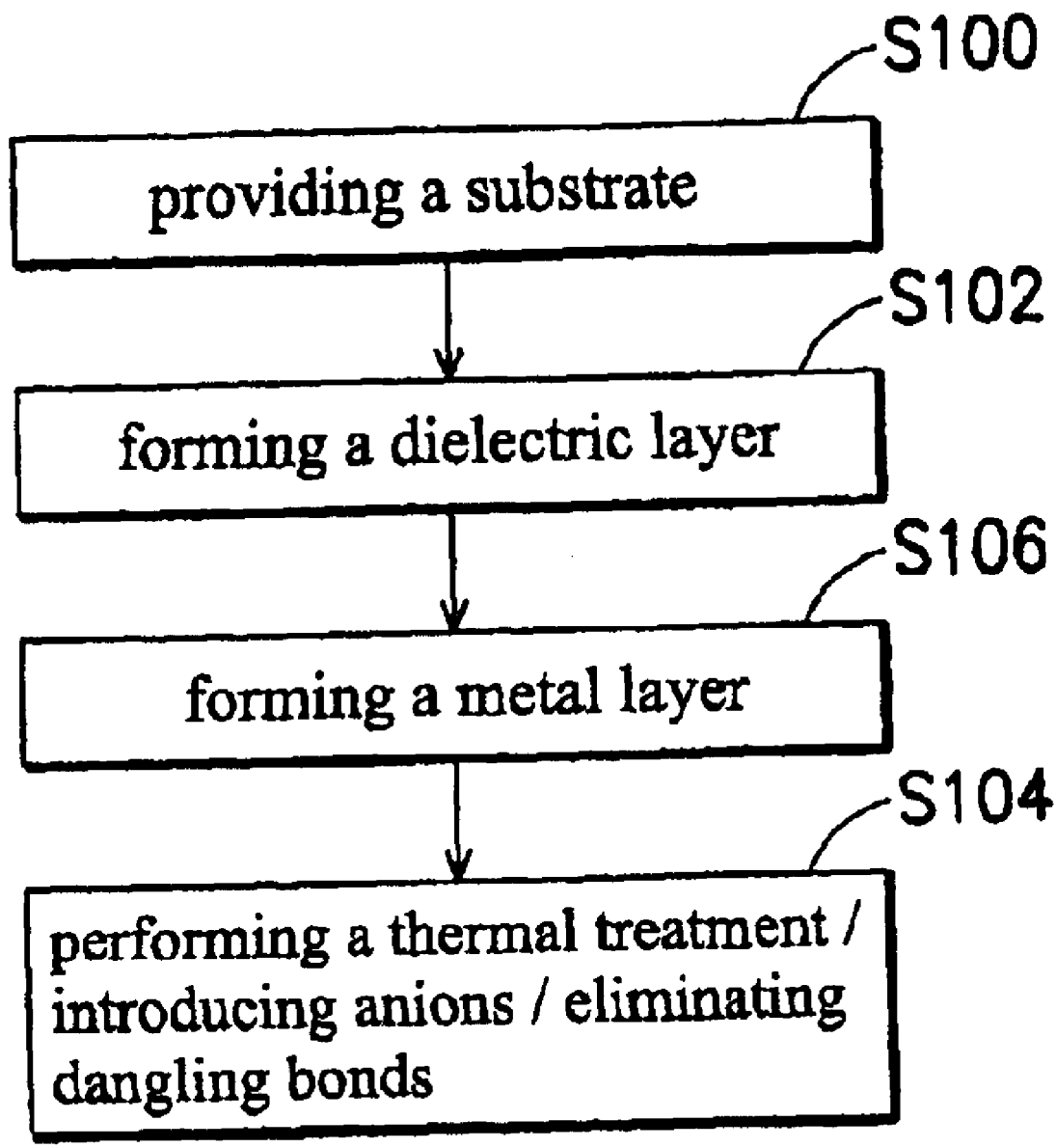
FIG. 3 is a flowchart illustrating steps of reducing charge loss for non-volatile memory according to the present invention.

Step S104 can be performed before or after step S102, as shown in FIG. 1 and FIG. 3. As well, step S104 can also be performed after step S106.

Figure 4:
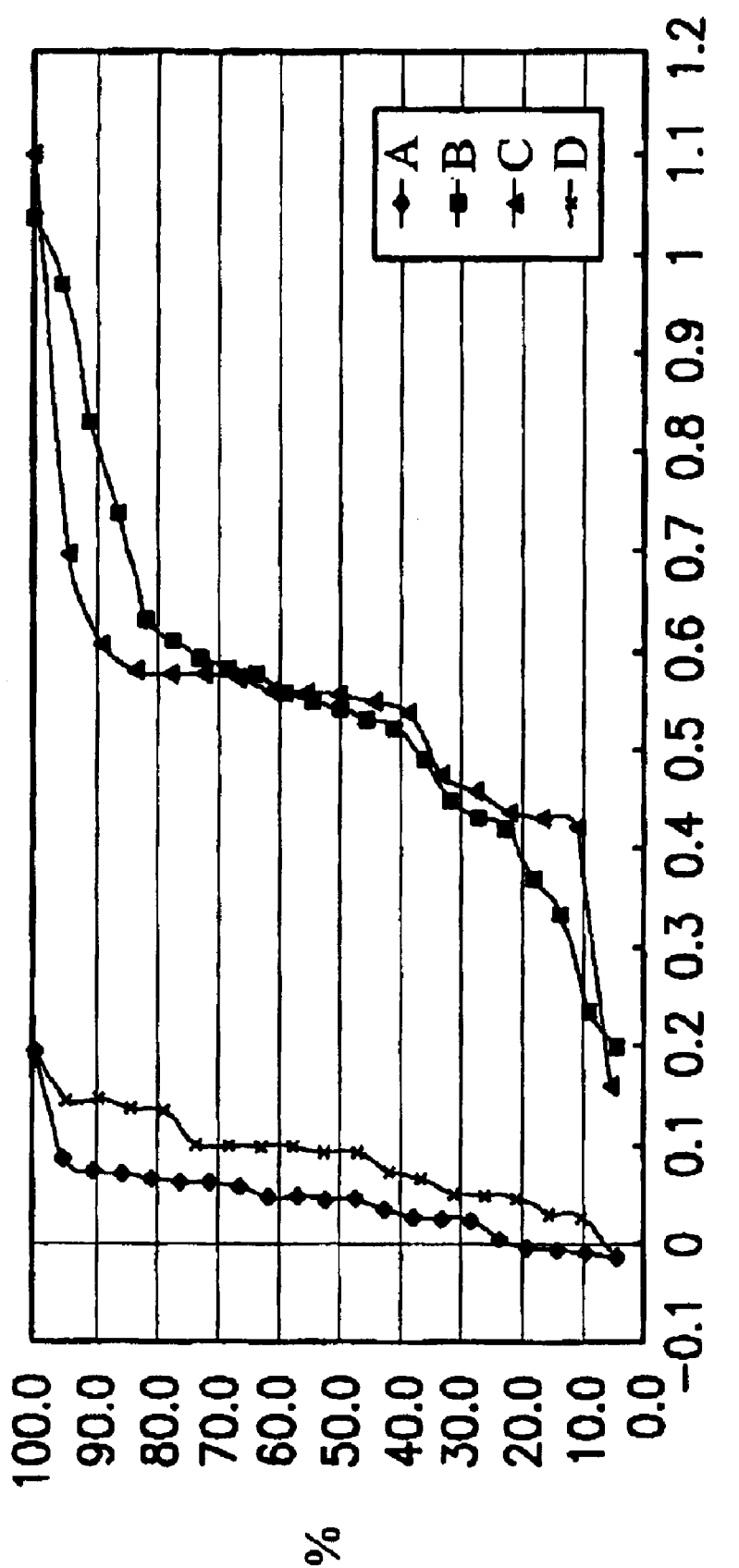
FIG. 4 shows a result of charge retention test for a device according to the present invention.

An analysis of charge retention testing for nonvolatility memory devices is shown in FIG. 4. nonvolatile memory memory device according to the invention and nonvolatile memory memory device according to the conventional manufacturing process are individually programed with a threshold voltage (V1) of about 7V. Then, the devices undergo a charge retention test by baking at 250 ° C. for 48 hours. After degradation simulating, the shift threshold voltage (V2) of the two devices measured, and the difference between the threshold voltage and the shift threshold voltage (V1–V2) is calculated. Curve B shows the result of the device flowed at 850 ° C. according to conventional manufacturing process, and curve C shows the result of the device flowed at 775 ° C. according to conventional manufacturing process. Curve A shows the result of the device flowed at 850 ° C. in an atmosphere containing oxygen according to the present invention, and curve C shows the result of the device flowed at 775 ° C. in an atmosphere containing oxygen according to the present invention. Both in curve B and C, the (V1–V2) of the 50 percentage are about 0.6. However, in curve A and D, the (V1–V2) of the 50 percentage are about 0.1. This indicates the charge loss of the devices based on the present invention is less than that of the conventional manufacturing process. It is an advantage of the present invention to enhance the charge retention for nonvolatile memory.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of reducing charge loss for nonvolatile memory comprising:

providing a semiconductor substrate having a semiconductor device thereon;

forming a dielectric layer on the entire surface of the semiconductor substrate;

performing a thermal treatment in an atmosphere containing a reactive gas, such that the reactive gas reacts with free ions remaining in the semiconductor substrate from manufacturing processes, wherein the free ions comprises $Na^+$ or $H^+$; and forming a metal layer on the dielectric layer.

2. The method as claimed in claim 1, wherein the dielectric layer comprises boro-phospho silicate glass (BPSG), phosphosilicate glass (PSG), or doped high density plasma oxide.

3. The method as claimed in claim 2, wherein the thermal treatment is performed for about 15~75 minutes.

4. The method as claimed in claim 1, wherein the temperature of the thermal treatment is about 500~800.

5. The method as claimed in claim 1, wherein the thermal treatment is performed after forming the dielectric layer.

6. The method as claimed in claim 1, wherein the thermal treatment is performed before forming the dielectric layer.

7. The method as claimed in claim 1, wherein the reactive gas comprises oxygen (O2), compounds containing nitrogen (N2) and oxygen (O2), or nitrous oxide (N2O).

8. The method as claimed in claim 1, further comprising forming a passivation on the metal layer after forming the metal layer.

9. The method as claimed in claim 1, wherein the thermal treatment is performed after forming the passivation.

* * * * *